(12) United States Patent
Wamura et al.

(10) Patent No.: US 9,929,008 B2
(45) Date of Patent: Mar. 27, 2018

(54) SUBSTRATE PROCESSING METHOD AND SUBSTRATE PROCESSING APPARATUS

(71) Applicant: Tokyo Electron Limited, Tokyo (JP)

(72) Inventors: Yu Wamura, Iwate (JP); Fumiaki Hayase, Iwate (JP); Masahiko Kaminishi, Iwate (JP); Yu Sasaki, Iwate (JP); Kosuke Takahashi, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 202 days.

(21) Appl. No.: 14/876,967

(22) Filed: Oct. 7, 2015

(65) Prior Publication Data

US 2016/0111278 A1 Apr. 21, 2016

(30) Foreign Application Priority Data

Oct. 16, 2014 (JP) ................... 2014-212007

(51) Int. Cl.
| | |
|---|---|
| *H01L 21/31* | (2006.01) |
| *H01L 21/02* | (2006.01) |
| *H01L 21/687* | (2006.01) |
| *C23C 16/455* | (2006.01) |
| *C23C 16/44* | (2006.01) |

(52) U.S. Cl.
CPC .... *H01L 21/02271* (2013.01); *C23C 16/4401* (2013.01); *C23C 16/455* (2013.01); *C23C 16/45551* (2013.01); *H01L 21/02189* (2013.01); *H01L 21/68764* (2013.01); *H01L 21/68771* (2013.01)

(58) Field of Classification Search
CPC ...................................................... H01L 21/31
See application file for complete search history.

(56) References Cited

U.S. PATENT DOCUMENTS

2014/0179121 A1* 6/2014 Ikegawa ........... H01L 21/02148
438/782

FOREIGN PATENT DOCUMENTS

| JP | 2011-018707 | 1/2011 |
|---|---|---|
| JP | 2014-107344 | 6/2014 |

* cited by examiner

*Primary Examiner* — Marvin Payen
(74) *Attorney, Agent, or Firm* — IPUSA, PLLC

(57) ABSTRACT

A substrate processing method is provided. In the method, a plurality of substrates is placed on a plurality of substrate holding areas provided in a surface of a turntable at predetermined intervals in a circumferential direction, the turntable being provided in a processing chamber. Next, the turntable on which the plurality of substrates is placed is rotated. Then, a fluid is supplied to the surface of the turntable while rotating the turntable. Here, the fluid is supplied to an area between the plurality of substrate holding areas in response to an operation of changing a flow rate of the fluid.

19 Claims, 10 Drawing Sheets

US 9,929,008 B2

SUBSTRATE PROCESSING METHOD AND SUBSTRATE PROCESSING APPARATUS

CROSS-REFERENCE TO RELATED APPLICATION

The present application is based upon and claims the benefit of priority of Japanese Patent Application No. 2014-212007, filed on Oct. 16, 2014, the entire contents of which are incorporated herein by reference.

BACKGROUND OF THE INVENTION

1. Field of the Invention

The present invention relates to a substrate processing method and a substrate processing apparatus.

2. Description of the Related Art

There exists a technology where a high dielectric constant material is used for an insulating layer of a memory cell of a semiconductor memory to increase the capacity of the semiconductor memory. Zirconium oxide (ZrO) is an example of a high dielectric constant material. ZrO has a dielectric constant of about 24 to 40, but has a low dielectric strength. Japanese Laid-Open Patent Application Publication No. 2011-18707 discloses a technology where the dielectric strength of ZrO is improved by adding aluminum (Al) to ZrO.

Meanwhile, there is a trend to increase the diameter of a semiconductor wafer (which is hereafter referred to as a "substrate") to reduce the costs of a semiconductor memory. Here, increasing the diameter of a substrate makes it necessary to improve the uniformity of a film across a surface of the substrate. For this purpose, for example, a film deposition method called an atomic layer deposition (ALD) method (or a molecular layer deposition (MLD) method) is used.

In the ALD method, one (reaction gas A) of two types of reaction gases that react with each other is adsorbed on a substrate surface, and the other one (reaction gas B) of the two types of reaction gases is caused to react with the reaction gas A adsorbed on the substrate surface, steps of which are repeated. Through this process, a reaction product of the reaction gas A and the reaction gas B is generated on the substrate surface, and a thin film made of the reaction product is deposited on the substrate surface.

When, for example, the ALD method is performed with a batch-type film deposition apparatus, the reaction gas A is supplied into a processing chamber where substrates are placed so that the reaction gas A is adsorbed on the surfaces of the substrates. Next, the processing chamber is evacuated or purged. Then, the reaction gas B is supplied into the processing chamber so that the reaction gas A adsorbed on the surfaces of the substrates reacts with the reaction gas B. As a result, a reaction product is generated on the surfaces of the substrates. The processing chamber is evacuated or purged again, and the above process is repeated until a thin film with a desired thickness is deposited on each of the substrates.

Moreover, when performing the film deposition method according to the ALD method on a plurality of substrates, the film deposition is performed by placing the plurality of substrates on a turntable provided in a processing chamber along a circumferential direction of the turntable and then rotating the turntable so as to cause the plurality of substrates to pass a plurality of reaction gas supply areas provided along the circumferential direction of the turntable in sequence. In the film deposition method, when a timing of discharging the reaction gas A and the reaction gas B is synchronized with the rotational period of the turntable, the reaction gases A and B are directly supplied to the same substrate among the plurality of substrates, which causes unevenness of the film deposition among the plurality of substrates. To prevent this, Japanese Laid-Open Patent Application Publication No. 2014-107344 discloses a film deposition method of setting the timing of discharging the reaction gases A and B so that the substrates to which the reaction gases A and B are directly supplied can be shifted during the film deposition.

However, in the film deposition method disclosed in Japanese Laid-Open Patent Application Publication No. 2011-18707 and Japanese Laid-Open Patent Application Publication No. 2014-107344, problems caused by stopping the film deposition apparatus for a long period of time, are not considered. When the film deposition apparatus is stopped for a long period of time, an internal pressure of a source tank is liable to increase, or raw materials attached to an inner surface of a pipe for supplying a source gas are liable to peel off from the inner surface. When a source gas is flown to a chamber under the circumstances, because particles caused by a change of the internal pressure of the source tank and particles having peeled off inside the pipe are liable to flow into the chamber, to prevent this, preflow may be performed in which the source gas is flown to a pump without passing the chamber before starting the film deposition process.

FIG. 1 is a diagram illustrating an example of a source gas supply line in a film deposition apparatus. As illustrated in FIG. 1, in a source gas supply line for supplying a source gas from a source tank 40 to a chamber 1a through a flow rate controller 39, when performing the preflow, a valve 38 of a vent line 35 connected to a vacuum pump 640 is opened while closing a valve 37 of a pipe 34 connected to the chamber 1a, which causes particles from a pipe 36 not to flow into the chamber 1a but to flow only to the vacuum pump 640. However, as illustrated in FIG. 1, because the preflow cannot care for some portions between the final valve 37 and the chamber 1a, particles are liable to be generated while supplying the source gas into the chamber 1a.

Furthermore, another substrate processing apparatus other than the film deposition apparatus may have a similar problem.

SUMMARY OF THE INVENTION

Accordingly, embodiments of the present invention may provide a substrate processing method and a substrate processing apparatus that can reduce negative influence of particles on a substrate process even when an apparatus had stopped for a long period of time.

According to an embodiment of the present invention, there is provided a substrate processing method. In the method, a plurality of substrates is placed on a plurality of substrate holding areas provided in a surface of a turntable at predetermined intervals in a circumferential direction, the turntable being provided in a processing chamber. Next, the turntable on which the plurality of substrates is placed is rotated. Then, a fluid is supplied to the surface of the turntable while rotating the turntable. Here, the fluid is supplied to an area between the plurality of substrate holding areas in response to an operation of changing a flow rate of the fluid.

According to another embodiment of the present invention, there is provided a substrate processing apparatus that includes a processing chamber and a turntable provided in the processing chamber. A plurality of substrate holding areas is provided in an upper of the turntable at predetermined intervals in a circumferential direction. The substrate processing apparatus further includes a fluid supply unit configured to supply a fluid to the upper surface of the turntable and a controller. The controller is configured to cause the fluid supply unit to supply the fluid to an area between the plurality of substrate holding areas by synchronizing an operation of changing a flow rate of the fluid while rotating the turntable.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF THE PREFERRED EMBODIMENTS

Figure 1:
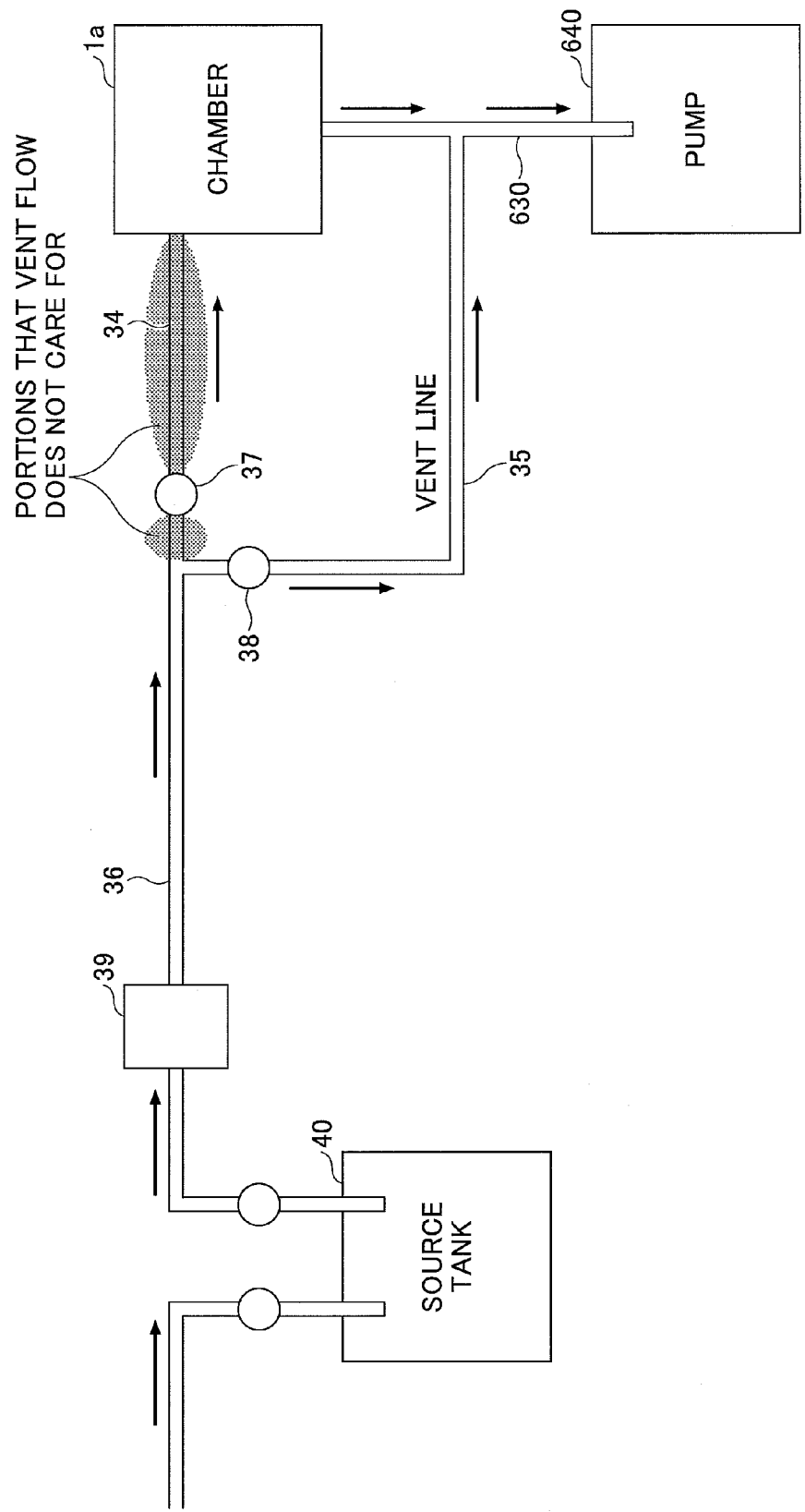
FIG. 1 is a diagram illustrating an example of a source supply line in a substrate processing apparatus.

A description is given below of embodiments of the present invention with reference to accompanying drawings.

A substrate processing method and a substrate processing apparatus according to the embodiments of the present invention can be applied to any other method and apparatus as long as the method and apparatus process a plurality of substrates by using a fluid in addition to the substrate processing method and the substrate processing apparatus described below. In the following embodiments, a description is given by citing an example of a film deposition method and a film deposition apparatus that perform a film deposition process on a substrate by using a gas as the fluid, but for example, other than the gas, foreign substances or particles may occur in a pipe of a substrate processing apparatus using a liquid. Moreover, a variety of substrate processing apparatuses for performing various substrate processes by using a fluid such as an etching apparatus can be considered other than the film deposition apparatus. The present invention can be applied to the variety of substrate processing methods and the substrate processing apparatuses.

Throughout the accompanying drawings, the same or similar reference numbers are used for the same or similar components, and overlapping descriptions of those components are omitted. Relationships among apparatuses and components are not limited to those illustrated in the drawings. A person having ordinary skill in the art may determine actual relationships among apparatuses and components by referring to the embodiments described below.

First Embodiment

A description is given below of a substrate processing apparatus according to a first embodiment of the present invention with reference to FIGS. 2 through 6. Here, the substrate processing apparatus according to the first embodiment of the present invention is a so-called turntable type (described later in detail) substrate processing apparatus in which surfaces of a plurality of substrates are processed by supplying a fluid to a predetermined supply area.

Figure 2:
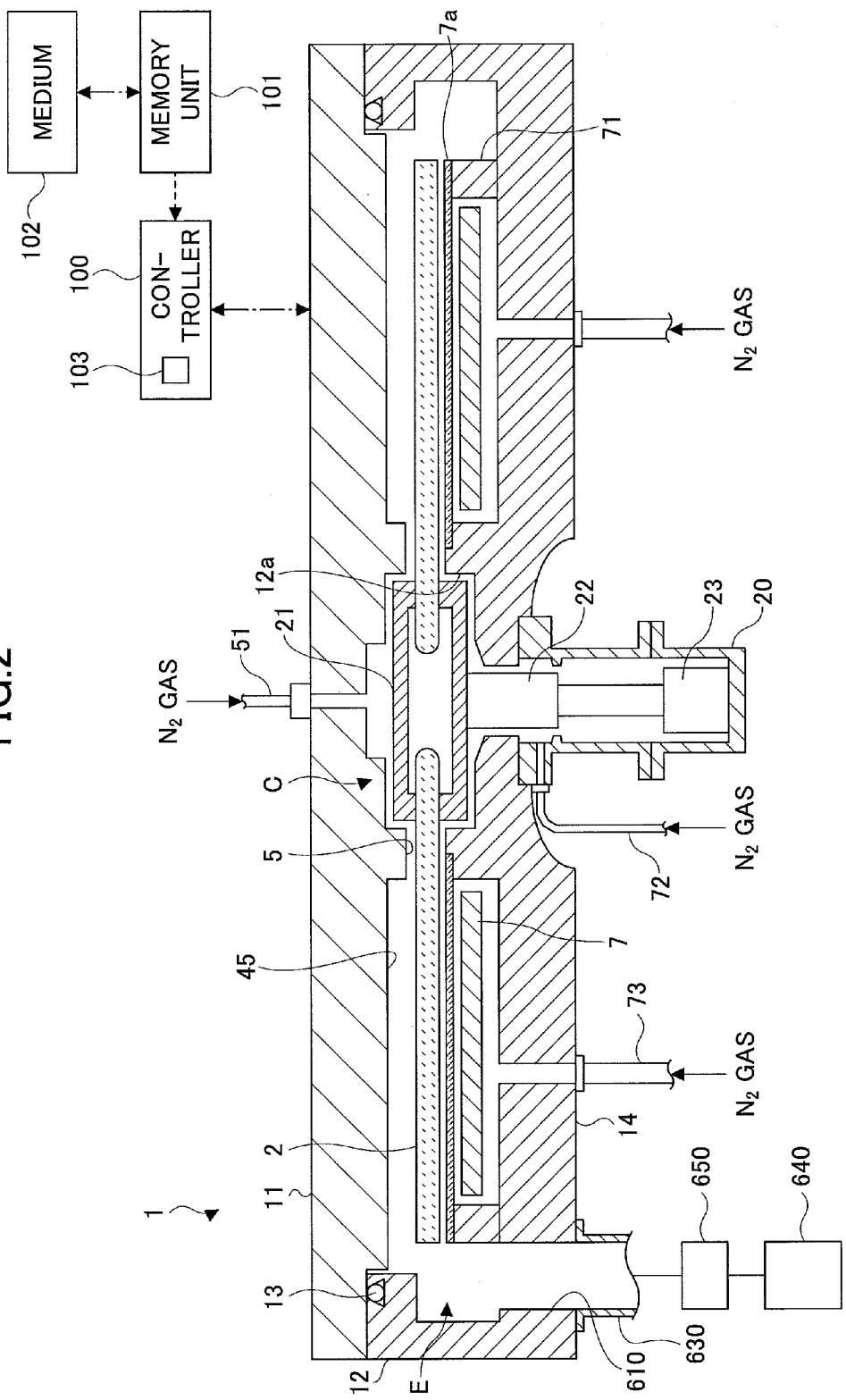
FIG. 2 is a cross-sectional view illustrating an example of a substrate processing apparatus according to a first embodiment of the present invention.
Figure 3:
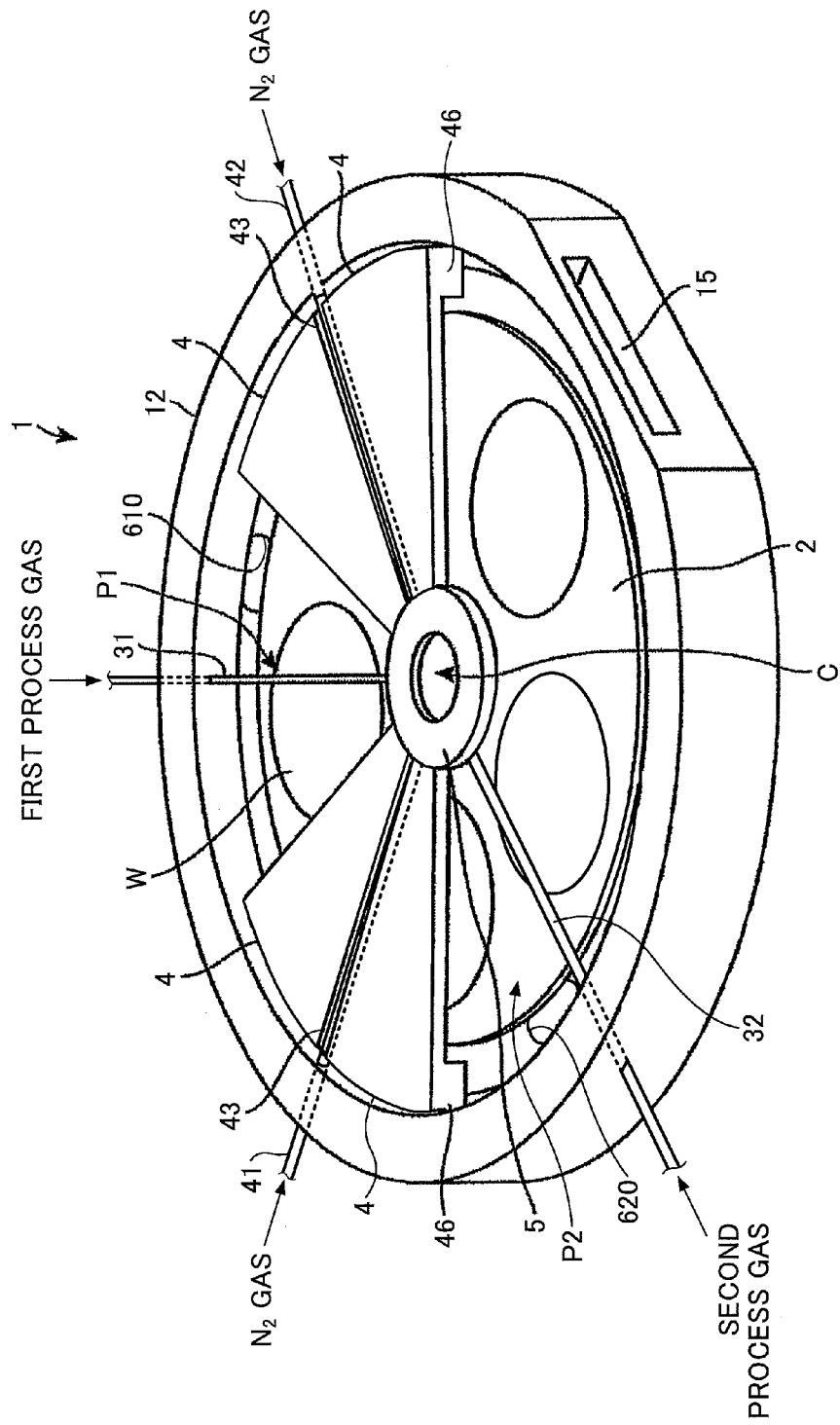
FIG. 3 is a perspective view illustrating a structure inside a vacuum chamber of the substrate processing apparatus of FIG. 2.
Figure 4:
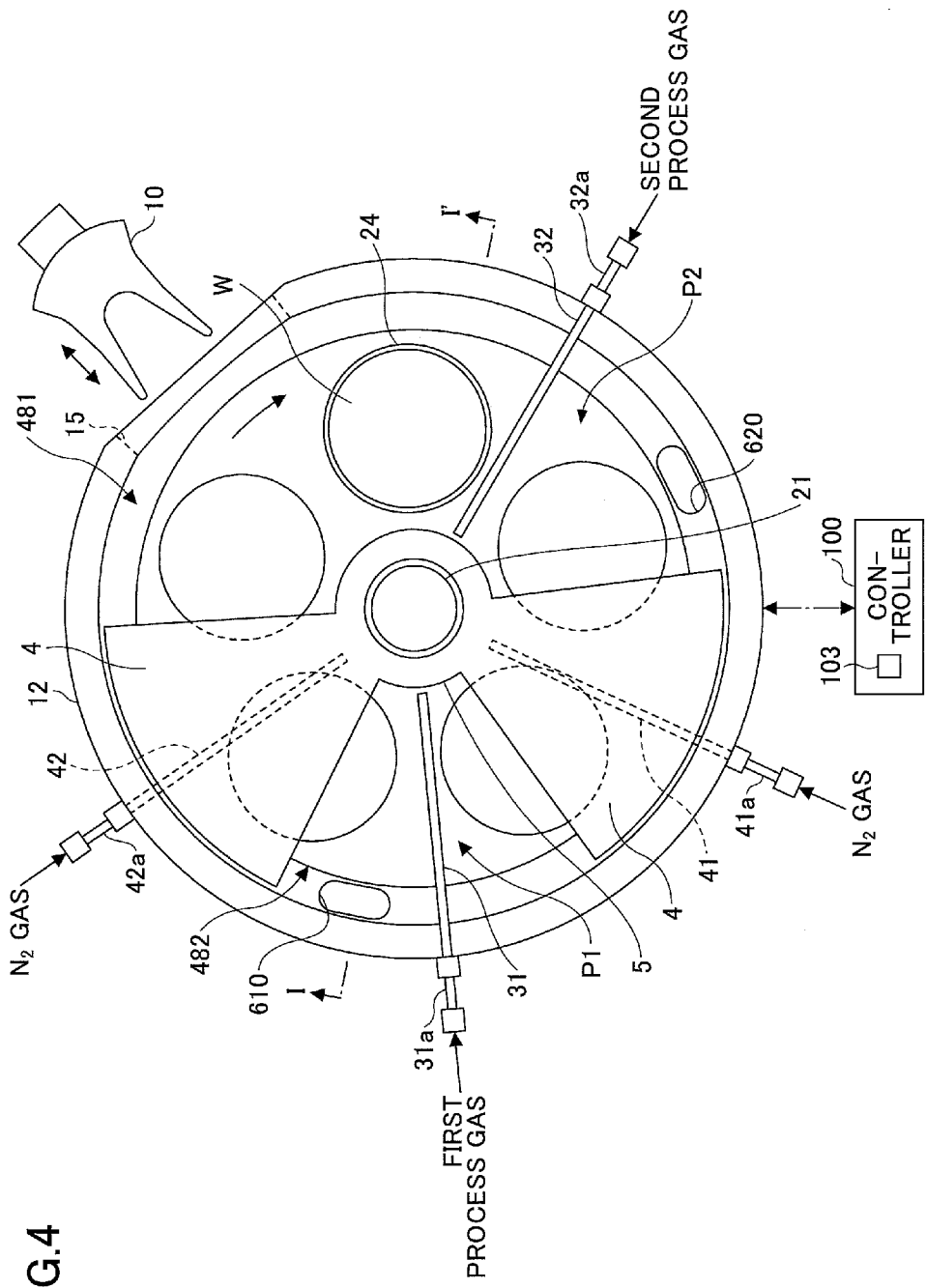
FIG. 4 is atop view illustrating a structure inside the vacuum chamber of the substrate processing apparatus of FIG. 2.

FIG. 2 is a cross-sectional view of the substrate processing apparatus taken along line I-I' of FIG. 4. FIGS. 3 and 4 are diagrams used to describe an exemplary internal structure of a processing chamber 1 (described later) of the substrate processing apparatus. In FIGS. 3 and 4, a top plate 11 (described later) is omitted for convenience of explanation.

Figure 5:
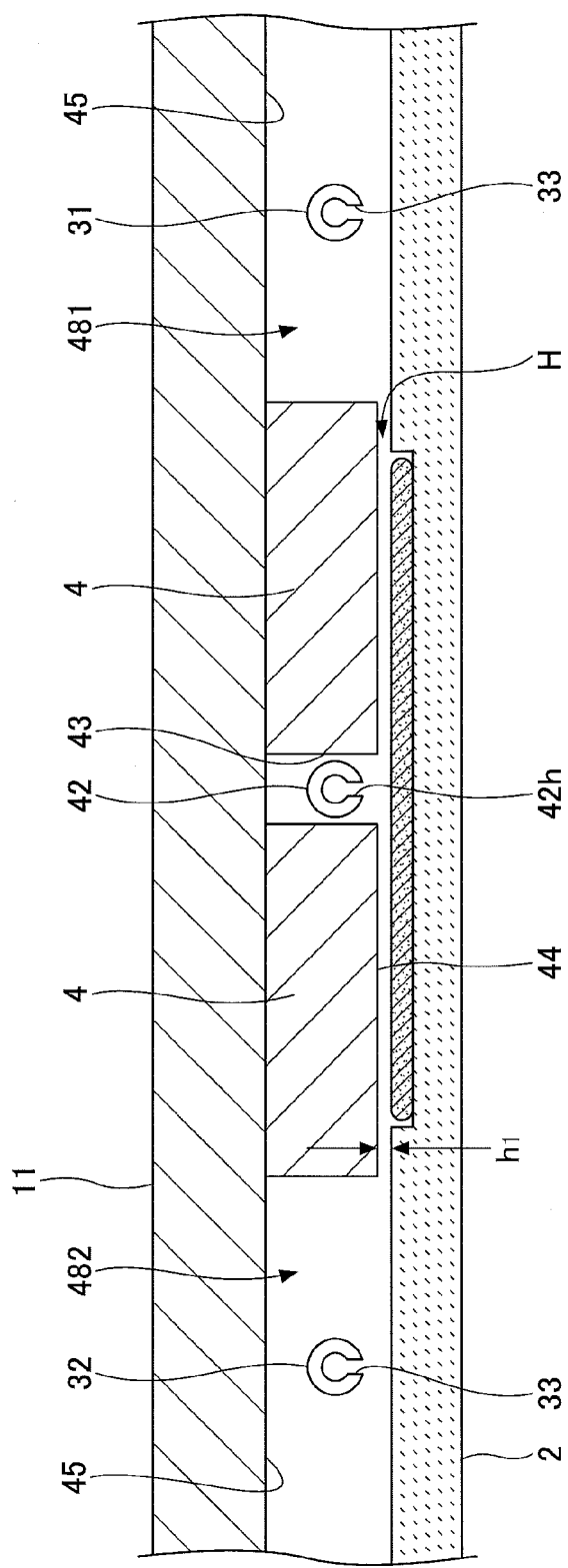
FIG. 5 is a partial cross-sectional view of the substrate processing apparatus of FIG. 2.
Figure 6:
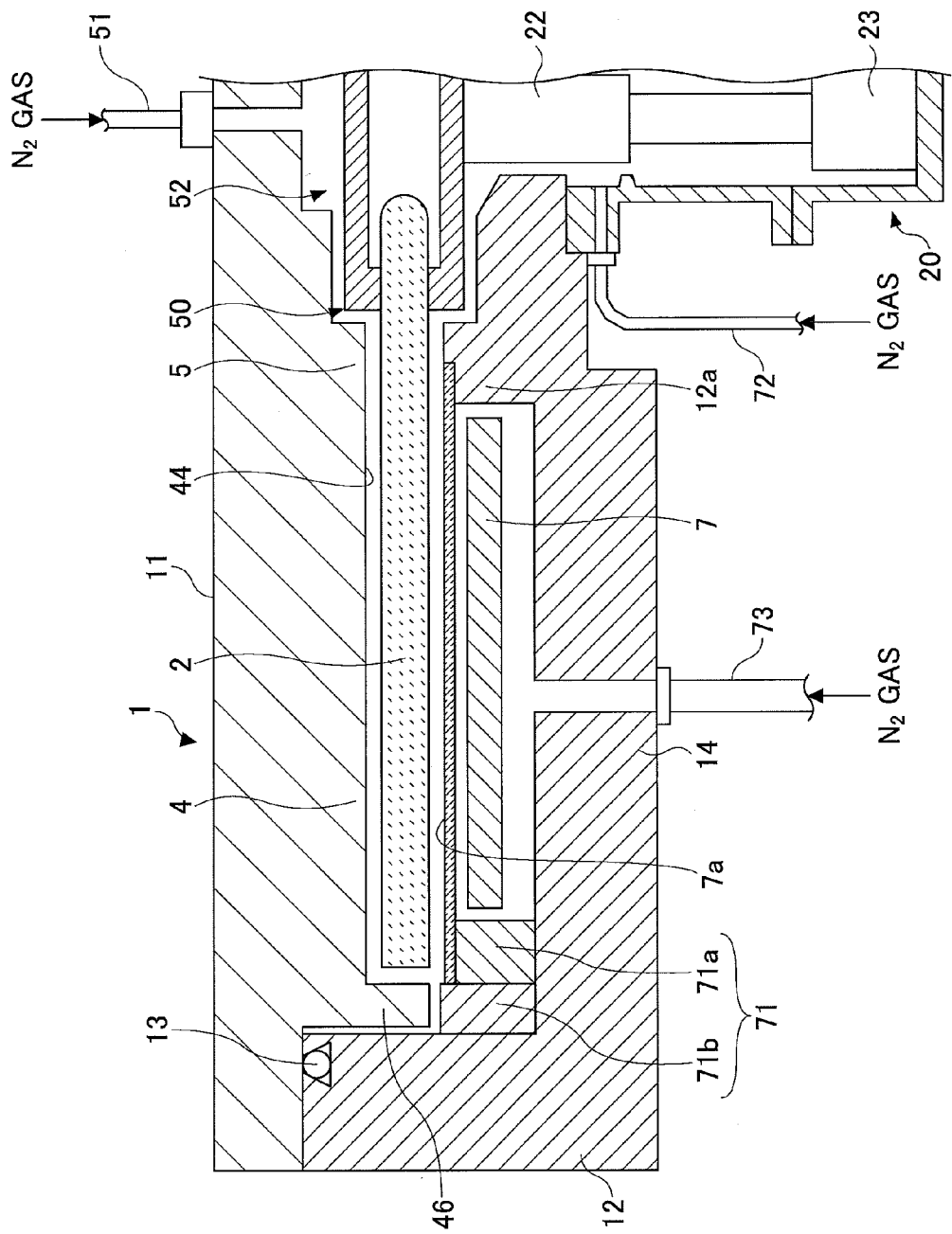
FIG. 6 is another partial cross-sectional view of the substrate processing apparatus of FIG. 2.

FIG. 5 is a cross-sectional view of apart of the processing chamber 1 from a process gas nozzle 31 to a process gas nozzle 32 taken along a concentric circle of a turntable 2 (described later). FIG. 6 is a partial cross-sectional view illustrating an area where a ceiling surface 44 is provided.

As illustrated in FIGS. 2 through 4, the substrate processing apparatus according to the first embodiment of the present invention includes the processing chamber 1 having a substantially circular shape in a plan view and a flat shape in a side view, the turntable 2 disposed in the processing chamber 1, and a controller (control unit) 100 for controlling operations of the entire substrate processing apparatus (e.g., the controller 100 controls a timing of supplying gases from process gas nozzles 31 and 32).

The processing chamber 1 includes a chamber body 12 shaped like a closed-end cylinder and a top plate 11 that is placed on the chamber body 12 and detachable from the chamber body 12. The top plate 11 is attached to the chamber body 12 via a sealing member 13 such as an O-ring and hermetically seals the processing chamber 1.

The turntable 2 is fixed to a cylindrical core part 21 housed in a case body 20 such that the center of the processing chamber 1 becomes the center of rotation of the turntable 2. The turntable 2 has holding areas in its upper surface to receive a plurality of substrates (which are hereafter referred to as "wafers W").

The case body 20 is a cylindrical case having an opening at its upper end. A flange at the upper end of the case body 20 is hermetically attached to a lower surface of a bottom part 14 of the processing chamber 1. The case body 20 isolates the internal atmosphere of the processing chamber 1 from the external atmosphere.

The core part 21 is fixed to an upper end of a rotational shaft 22 that extends in the vertical direction. The rotational shaft 22 passes through the bottom part 14 of the processing chamber 1. A lower end of the rotational shaft 22 is attached to a drive unit 23 that rotates the rotational shaft 22 about a vertical axis. The rotational shaft 22 and the drive unit 23 are housed in the case body 20.

As illustrated in FIG. 4, multiple (five in the present embodiment) recesses 24 for holding the wafers W (substrate holding areas) are formed in the upper surface of the turntable 2. The recesses 24 have a substantially circular shape and are arranged along the rotational direction (or the circumferential direction) of the turntable 2. In FIG. 4, for convenience sake, only one wafer W placed in one of the recesses 24 is illustrated. The number of wafers W that the turntable 2 can hold is not limited to five. The turntable 2 may instead be configured to hold four or less wafers W or six or more wafers W.

In the present embodiment, each of the recesses 24 has an inside diameter (e.g., 4 mm greater than the diameter of the wafer W) that is slightly greater than the diameter (e.g., 300 mm) of the wafer W. The depth of each of the recesses 24 is substantially the same as the thickness of the wafer W. This causes the height of the upper surfaces of the wafers W placed in the recesses 24 to become substantially the same as the height of the upper surface (where the wafers W are not placed) of the turntable 2.

In the substrate processing apparatus of the present embodiment, the process gas nozzle 31 is a first gas supply part and is disposed in a first process area (described later) above the turntable 2. The process gas nozzle 32 is a second gas supply part and is disposed in a second process area (described later) that is apart from the first process area in the circumferential direction of the turntable 2. Separation gas nozzles 41 and 42 are separation gas supply parts and are disposed between the first process area and the second process area. For example, the nozzles 31, 32, 41, and 42 may be made of quartz.

More specifically, as illustrated in FIGS. 3 and 4, the process gas nozzle 31, the separation gas nozzle 41, the process gas nozzle 32, and the separation gas nozzle 42 are arranged clockwise (along the rotational direction of the turntable 2) in this order from a transfer opening 15 for transferring the wafers W. In other words, the process gas nozzle 31, the separation gas nozzle 41, the process gas nozzle 32, and the separation gas nozzle 42 are arranged at intervals along the circumferential direction of the processing chamber 1. Gas introduction ports 31a, 32a, 41a, and 42a, which are outer ends of the gas nozzles 31, 32, 41, and 42, are fixed to the outer wall of the chamber body 12. The gas nozzles 31, 32, 41, and 42 are inserted through the outer wall of the chamber body 12 into the processing chamber 1. In the processing chamber 1, the gas nozzles 31, 32, 41, and 42 extend parallel to the upper surface of the turntable 2 in the radial direction of the chamber body 12 toward the center of rotation of the turntable 2.

Gas discharge holes (see FIG. 5) facing the turntable 2 are formed in the lower surface of each of the process gas nozzles 31 and 32. For example, the gas discharge holes may be arranged at 10-mm intervals in the lengthwise direction of the corresponding process gas nozzle 31 or 32. An area below the process gas nozzle 31 functions as an area for causing a first process gas to adsorb on a wafer W (which is hereinafter referred to as a "first process area P1"). An area below the process gas nozzle 32 functions as an area for causing a second gas to react with the first process gas adsorbed on the wafer W so as to deposit a reaction product of the first process gas and the second process gas (which is hereinafter referred to as a "second process area P2"). For example, a source gas such as TEMAZ (Tetrakis(ethylmethylamino)zirconium) gas or TMA (TrisMethyl Aluminium) gas or the like may be used as the first process gas, and a reaction gas such as an oxidation gas (e.g., $O_2$ gas or $O_3$ gas), a nitriding gas (e.g., $NH_3$ gas) or the like may be used as the second process gas.

The process gas nozzle 31 is disposed in the first process area P1 that is zoned above the upper surface of the turntable 2. The process gas nozzle 31 is connected to a gas supply source (not shown) for supplying a first process gas 40 via pipes 34 and 36, a valve 37, and a flow rate controller 39 (e.g., massflow controller) that are illustrated in FIG. 1. Thus, the process gas nozzle 31 supplies the first process gas to the upper surface of the turntable 2.

The process gas nozzle 32 is disposed in the second process area P2 that is zoned above the upper surface of the turntable 2. The process gas nozzle 32 is connected to a gas supply source (not shown) for supplying the second process gas via a pipe and the like (not shown). Thus, the process gas nozzle 32 supplies the second process gas to the upper surface of the turntable 2. In the present embodiment, the process gas nozzle 32 supplies the second process gas into the processing chamber 1 (the second process area P2) by complementarily opening and closing valves (not shown).

Each of the separation gas nozzles 41 and 42 is disposed between the first process area P1 and the second process area P2. Each of the separation gas nozzles 41 and 42 is connected to a gas supply source (not shown) for supplying a separation gas via a pipe and the like (not shown). Thus, the separation gas nozzles 41 and 42 supply the separation gas to the upper surface of the turntable 2.

The substrate processing apparatus of the present embodiment can use a variety of source gases as the first process gas, but may use, for example, a gas (or vapor) containing zirconium (Zr), hafnium (Hf), aluminum (Ar) or titanium (Ti) as the first process gas. These source gases are, for example, an organometallic source gas containing each metal.

The substrate processing apparatus of the present embodiment can use a variety of reaction gases reactable with the first process gas as the second process gas, but may use, for example, an oxygen-containing gas as the second process gas. The oxygen-containing gas is, for example, oxygen gas or ozone gas. The first process gas supplied from and process gas nozzle 21 and adsorbed on the substrate is oxidized by the second process gas supplied from the process gas nozzle 32, thereby generating an oxidation product (e.g., ZrO, HfO, AlO or TiO).

Here, the first process gas and the second process gas are not limited to the above examples. For example, a combination of using a Si-containing gas as the first process gas and an oxidation gas as the second process gas is possible, or a combination of using $TiCl_4$ gas as the first process gas and $NH_3$ gas as the second process gas is also possible. A variety of process gases can be used as the first and second process gases depending on a process to be performed.

In the present embodiment, the substrate processing apparatus uses an inert gas as the separation gas. Examples of the inert gas include argon (Ar) gas, helium gas, and nitrogen gas. The separation gas is used as a purge gas for purging the wafer W. In the present embodiment, a description is given below of an example of using $N_2$ gas, which is generally used as the purge gas, as the separation gas.

As illustrated in FIGS. 3 and 4, multiple (in this example, two) convex portions 4 are provided in the processing chamber 1 of the substrate processing apparatus. In a plan view, each convex portion 4 has an approximately sectorial shape whose top part is cut off to form an arc (inner arc). In the present embodiment, the inner arc of the convex portion 4 is connected to a protruding portion 5. The convex portion 4 is disposed such that its outer arc (which is at an end of the convex portion 4 opposite to the inner arc) becomes substantially parallel to the inner circumferential surface of the chamber body 12 of the processing chamber 1.

More specifically, as illustrated in FIG. 5, the convex portions 4 are attached to the lower surface of the top plate 11. The convex portion 4 includes a flat lower surface that is referred to as a ceiling surface 44 (first ceiling surface). Parts of the lower surface of the top plate 11 on both sides of the ceiling surface 44 in the circumferential direction are referred to as ceiling surfaces 45 (second ceiling surfaces). The ceiling surfaces 45 are higher than the ceiling surface 44. Thus, the convex portion 4 forms a narrow separation space(s) H and spaces 481 and 482, into which gas flows from the separation space H, in the processing chamber 1. In other words, the convex portions 4 form narrow separation spaces H that function as separation areas D illustrated in FIG. 6.

Also, as illustrated in FIG. 4, a groove 43 is formed in the middle in the circumferential direction of the convex portion 4. The groove 43 extends in the radial direction of the turntable 2. The separation gas nozzle 42 is placed in the groove 43 of one of the convex portions 4, and the separation gas nozzle 41 is placed in the groove 43 of the other one of the convex portions 4.

Here, gas discharge holes 42h are formed in a lower surface of the separation gas nozzle 42, which faces the turntable 2. The gas discharge holes 42h are arranged at predetermined intervals (e.g., 10-mm intervals) in the lengthwise direction of the separation gas nozzle 42. The opening diameter of each of the gas discharge holes 42h is, for example, from about 0.3 mm to about 1.0 mm. Although not illustrated in the drawings, gas discharge holes are also formed in the separation gas nozzle 41 in a similar manner.

Also, as illustrated in FIG. 5, the process gas nozzles 31 and 32 are disposed in spaces below the ceiling surfaces 45. The process gas nozzles 31 and 32 are positioned apart from the ceiling surfaces 45 and close to the wafer W or the upper surface of the turntable 2. Here, as illustrated in FIG. 5, the process gas nozzle 31 is disposed in the space 481 below the ceiling surface 45, and the process gas nozzle 32 is disposed in the space 482 below the ceiling surface 45.

The narrow separation space H is formed between the ceiling surface 44 and the upper surface of the turntable 2. When an inert gas (e.g., $N_2$ gas) is supplied from the separation gas nozzle 42, the inert gas flows into the spaces 481 and 482 through the separation space H. Because the volume of the separation space H is smaller than the volumes of the spaces 481 and 482, the pressure in the separation space H where the inert gas is supplied becomes higher than the pressures in the spaces 481 and 482. Thus, the separation space H provides a pressure barrier between the spaces 481 and 482.

Furthermore, the flow of the inert gas from the separation space H into the spaces 481 and 482 functions as a counter flow to the first process gas in the first process area P1 and the second process gas in the second process area P2. Thus, the substrate processing apparatus of the present embodiment is configured to separate the first process gas in the first process area P1 from the second process gas in the second process area P2 by using the separation space H. In other words, the substrate processing apparatus is configured to prevent the first process gas from mixing and reacting with the second process gas in the processing chamber 1.

A height h1 of the ceiling surface 44 from the upper surface of the turntable 2 can be determined based on the pressure in the processing chamber 1 during a film deposition process, the rotational speed of the turntable 2, and/or the amount of the supplied separation gas ($N_2$ gas) so that the pressure in the separation space H becomes higher than the pressures in the spaces 481 and 482. The height h1 of the ceiling surface 44 from the upper surface of the turntable 2 can be also determined based on the specifications of the substrate processing apparatus and types of supplied gases. Furthermore, the height h1 of the ceiling surface 44 from the upper surface of the turntable 2 can be determined in advance by experiments or calculations.

As illustrated in FIGS. 3 and 4, the protruding portion 5 is provided on the lower surface of the top plate 11 to surround the core part 21 to which the turntable 2 is fixed. The protruding portion 5 is connected to the center-side ends (inner arcs) of the convex portions 4. The lower surface of the protruding portion 5 is formed to have the same height as the ceiling surface 44.

As illustrated in FIG. 6, an L-shaped bent portion 46 is formed at the outer end of the convex portion 4 (i.e., an end that is closer to the inner circumferential surface of the vacuum chamber 1). The bent portion 46 faces the outer end surface of the turntable 2. The bent portion 46 prevents gases from flowing between the space 481 and the space 482 through a gap between the turntable 2 and the inner circumferential surface of the chamber body 12. The convex portion 4 is attached to or formed on the lower surface of the top plate 11.

A small gap is provided between the outer surface of the bent portion 46 and the chamber body 12 so that the top plate 11 can be detached from the chamber body 12. For example, the gap between the inner surface of the bent portion 46 and the outer end surface of the turntable 2 and the gap between the outer surface of the bent portion 46 and the chamber body 12 can be set at a value that is substantially the same as the height of the ceiling surface 44 from the upper surface of the turntable 2.

Referring to FIG. 4 again, a first evacuation port 610 in communication with the space 481 (FIG. 4) and a second evacuation port 620 in communication with the space 482 (FIG. 4) are formed between the turntable 2 and the inner circumferential surface of the chamber body 12. As illustrated in FIG. 2, each of the first evacuation port 610 and the second evacuation port 620 is connected to an evacuation unit (e.g., a vacuum pump 640) via an evacuation pipe 630. Here, a pressure controller 650 may be provided in the evacuation pipe 630 between each of the first and second evacuation ports 610 and 620 and the vacuum pump 640.

As illustrated in FIGS. 2 and 6, a heater unit 7 is provided in a space between the turntable 2 and the bottom part 14 of the vacuum chamber 1. The heater unit 7 heats, via the turntable 2, the wafers W on the turntable 2 to a temperature (e.g., 450° C.) specified by a process recipe. A ring-shaped cover member 71 is provided below the outer periphery of the turntable 2. The cover member 71 prevents entry of gases into a space below the turntable 2.

As illustrated in FIG. 6, the cover member 71 includes an inner member 71a and an outer member 71b. The inner member 71a is provided below the turntable 2 and spans an area that corresponds to the outer periphery of the turntable 2 and a narrow space surrounding the outer circumference of the turntable 2. The outer member 71b is provided between the inner member 71a and the inner circumferential surface of the vacuum chamber 1. The outer member 71b is disposed below the bent portion 46 formed at the outer end of the convex portion 4 such that a small gap is formed between the outer member 71b and the lower end of the bent portion 46. The inner member 71a surrounds the heater unit 7.

The controller (control unit) 100 illustrated in FIG. 1 sends commands (or signals) to other components of the substrate processing apparatus, thereby controlling the components. The controller 100 may be constituted of a computer or an arithmetic processing unit for controlling operations of the entire substrate processing apparatus. For example, the controller 100 executes a program stored in a memory unit 101 to control hardware components of the substrate processing apparatus, thereby depositing a film on the surfaces of the plurality of wafers W. The controller 100 may include a central processing unit (CPU) and a memory (e.g., ROM or RAM).

More specifically, the memory of the controller 100 may store a program for causing the substrate processing apparatus (or the CPU) to perform a substrate processing method described later. The program may include code units corresponding to steps to be performed in the substrate processing method. The controller 100 reads the program from a storage medium 102 (e.g., a hard disk, a compact disk, a magneto-optical disk, a memory card, or a flexible disk), stores the program in the memory unit 101, and installs or loads the program into the controller 100.

Moreover, a time measurement part 103 for measuring time such as a timer and the like may be built in the controller 100. For example, the time measurement part 103 measures start time of rotating the turntable 2 and elapsed time from starting the rotation of the turntable 2.

The controller 100 controls a timing of supplying the process gas so as to supply the process gas not to the surface of the wafer W but to an area between the adjacent recesses 24 holding the wafers W when performing any operation of changing the flow rate of the process gas supplied from the first process gas nozzle 31 and/or the second process gas nozzle 32. In other words, in supplying the first process gas from the first process gas nozzle 31 and/or the second process gas from the second process gas nozzle 32 to the upper surface of the turntable 2, each of the process gases is not supplied to the turntable 2 when the wafer W is at a position right under the first process gas nozzle 31 and/or the second process gas nozzle 32, but supplied to the turntable 2 when the area without the wafer W is at the position right under the first process gas nozzle 31 and/or the second process gas nozzle 32.

Here, the operation of changing the supply flow rate of the process gas includes an operation of starting the supply of any of the process gases from the first process gas nozzle 31 and/or the second process gases nozzle 32, an operation of stopping the supply of any of the process gas, and an operation of changing the flow rate of any of the supplying process gases. In other words, when starting the supply of the process gas from the first process gas nozzle 31 and/or the second process gas nozzle 32 after stopping the substrate processing apparatus for a long period of time for maintenance and the like, particles are likely to accumulate inside the pipes 34 and 35 for the long-term stop, and the accumulated particles are liable to be supplied to the surface of the wafer W. When the particles are supplied to the surface of the wafer W from the first process gas nozzle 31 and/or the second process gas nozzle 32, the particles are likely to be spread lineally on the wafer W, which is liable to become a defective product.

Accordingly, to prevent such a situation from happening, in the substrate processing apparatus of the present embodiment, the controller 100 controls the start timing of supplying the process gas so as to start supplying the process gas not to the surface of the wafer W but to the upper surface of the turntable 2 between the wafers W.

Figure 7:
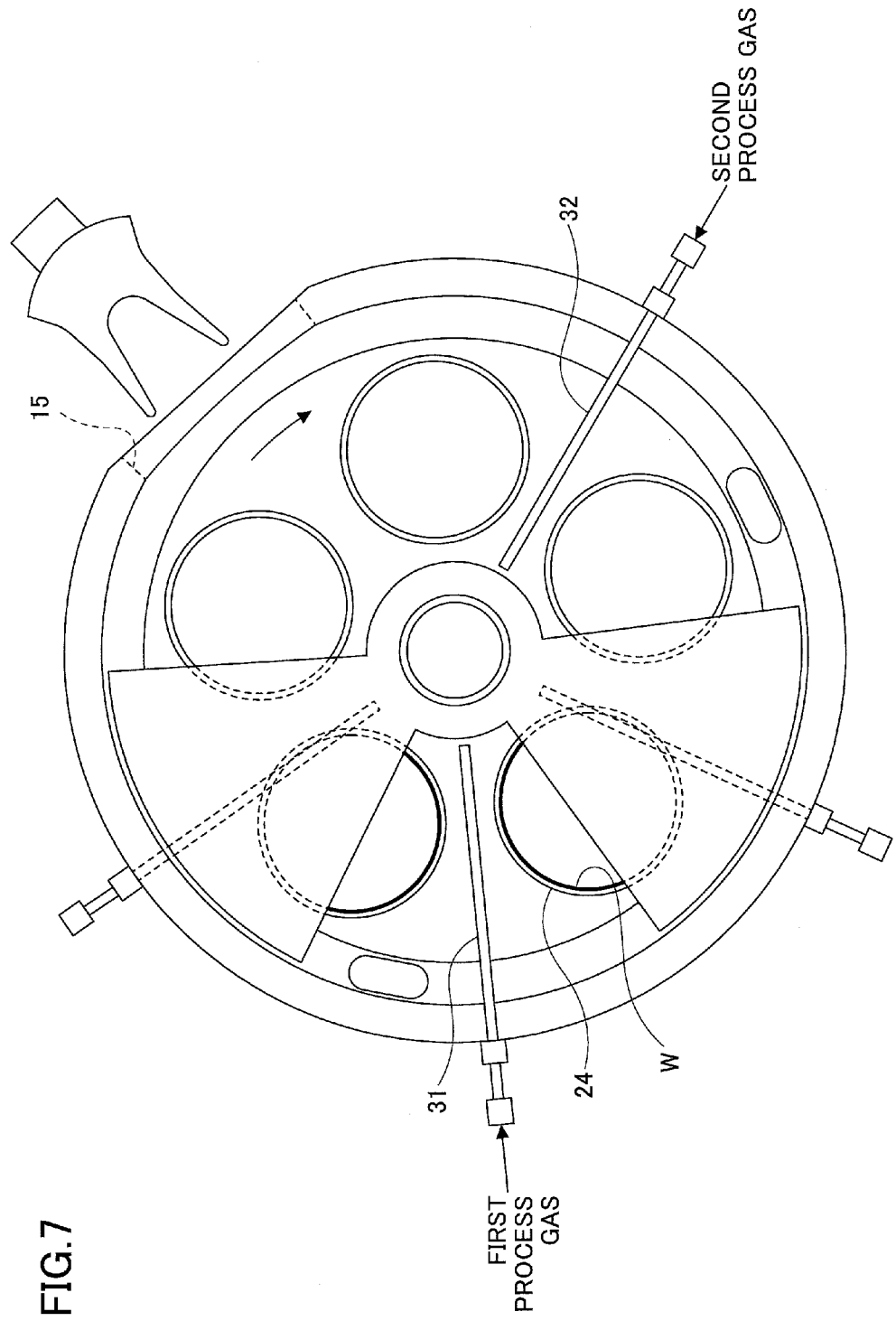
FIG. 7 is a diagram for explaining a supply timing of a process gas of a substrate processing method according to the first embodiment of the present invention.

FIG. 7 is a diagram for explaining a start timing of supplying the process gas. As illustrated in FIG. 7, the wafers W are placed on the plurality of recesses 24 that are substrate holding areas, and the first process gas nozzle 31 is at a position between the wafers W. As described at FIG. 5, because the first process gas nozzle 21 has the gas discharge holes 33 in its lower surface facing the upper surface of the turntable 2, the first process gas is directly supplied to the area right under the first process gas nozzle 31. Hence, even if the particles accumulate inside the pipes 34 and 36 due to the stop of the substrate processing apparatus for a long period of time and the particles are scattered with the supply of the first process gas when the first process gas nozzle 31 starts supplying the first process gas, the particles can be prevented from directly scattering over the wafer W.

Figure 8:
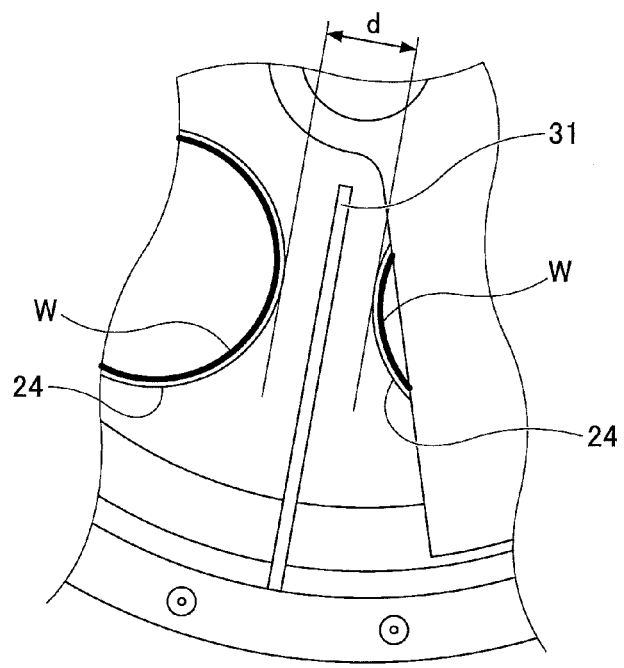
FIG. 8 is a diagram for explaining a timing of starting supply of a first process gas from a first process gas nozzle in more detail.

FIG. 8 is a diagram for explaining the start timing of supplying the first process gas from the first process gas nozzle 31 in more detail. Because the turntable 2 already rotates when starting the supply of the first process gas from the first process gas nozzle 31, as illustrated in FIGS. 7 and 8, the timing of starting the supply of the first process gas from the first process gas nozzle 31 needs to be set at a time when the area between the recesses 24 holding the wafers W arrives at the position right under the first process gas nozzle 31. To begin with, when a distance between the adjacent recesses 24 is expressed as a letter "d" and a hole diameter of the discharge holes 33 of the first process gas nozzle 31 is expressed as a letter "a", the distance d between the recesses 24 naturally needs to be broader than the hole diameter a of the discharge holes 33 of the first profess gas nozzle 31. In addition to this, positions of the wafers W on the turntable 2 are obtained, and the start timing of supplying the first process gas from the first process gas nozzle 31 is set so as not to coincide with the timing when the wafer W is at the position right under the first process gas nozzle 31.

Here, the present embodiment cites an example of forming five of the recesses 24 in the upper surface of the turntable 2 to be able to hold five of the wafers W thereon. In this case, the distance d between the adjacent recesses 24 is a few centimeters and the control of the start timing of supplying the process gas is relatively easy, but when six of the recesses 24 are formed in the upper surface of the turntable 2, the distance d between the adjacent recesses 24 becomes a few or several millimeters and the control of the start timing of supplying the process gas requires accuracy to some extent. In such a case, an appropriate start timing of supplying the process gas needs to be set by properly considering the above-mentioned relationship between the distance d between the adjacent recesses and the hole diameter a of the discharge holes 33 of the first process gas nozzle 31. Moreover, the start timing is controlled so that actual time of discharging the first process gas from the discharge holes 33 of the first process gas nozzle 31 becomes the appropriate timing by considering delay time and the like caused by gas moving time in the pipes 34 and 36 and the like as necessary.

The positions of the wafers W can be obtained from an initial status of positions of the wafers W and a rotational status of the turntable 2. More specifically, initial positions of the wafers W can be obtained by carrying the wafers W on the processing chamber 1 and performing alignment while placing the wafers W on the turntable 2 in sequence. Then, when starting the rotation of the turntable 2, the positions of the wafers W can be calculated by obtaining start time of the rotation of the turntable 2, a rotational speed, and elapsed time from starting the rotation of the turntable 2 based thereon. As described above, the start time of the rotation of the turntable 2 and the elapsed time from starting the rotation of the turntable 2 can be measured by the time measurement part 103 in the controller 100. Moreover, because the rotational speed of the turntable 2 is provided from the process recipe, for example, through the storage medium 102, the controller 100 can naturally obtain the rotational speed of the turntable 2. Accordingly, the controller 100 can obtain the positions of the wafers W, based on which the controller 100 controls the start timing of supplying the first process gas from the first process gas nozzle 31 and the operation of the first process gas nozzle 31 so as to start the supply of the first process gas at the timing as illustrated in FIGS. 7 and 8. In this manner, the substrate processing method of the present embodiment can be implemented by causing the controller 100 to obtain the positions of the wafers W on the turntable 2 and then to control the start timing of supplying the first process gas from the first process gas nozzle 31.

Similar control can be applied to the second process gas nozzle 32 as well as the first process gas nozzle 31. Although the second process gas that is a reaction gas such as an oxidation gas, a nitriding gas or the like is thought to generate particles in the pipe less than the first process gas that is a source gas, because there is still concern about the particle accumulation in the second process gas, performing the above-mentioned control of the start timing of supplying the process gas with respect to the second process gas is preferred. Hence, when the substrate processing apparatus includes a plurality of process gas nozzles 31 and 32, performing the control of the start timing of supplying the process gas with respect to all of the process gas nozzles 31 and 32 is the most preferable. However, because a variety of forms can be taken depending on the intended purpose, the control can be adapted only to the process gas nozzle 31 for supplying the source gas, or, vice versa, only to the process gas nozzle 32 for supplying the reaction gas depending on the intended use. Thus, the process gas nozzles 31 and 32 targeted by the control of the start timing of supplying the process gas are selective variously depending on the intended purpose.

Furthermore, the control of a timing for changing the supply operation of the process gas from the process gas nozzles 31 and 32 can be applied not only to the start timing of supplying the process gas but also to the case of stopping the supply of the process gas. More specifically, because the supply flow rate also changes when stopping the supply of the process gas from the first process gas nozzle 31 and/or the second process gas nozzle 32, if particles are present in the pipes 34 and 36, the particles are liable to spread over the wafer W due to the change of the supply flow rate. Hence, the wafer W is not preferred to be present at a position right under the first process gas nozzle 31 and/or the second process gas nozzle 32, but the upper surface of the turntable 2 exposed between the wafers W is preferred to be present at the position right under the first process gas nozzle 31 and/or the second process gas nozzle 32 at a time not only when starting the supply of the process gas but also when stopping the supply of the process gas. Accordingly, the controller 100 stops the supply of the process gas from the first process gas nozzle 31 and/or the second process gas nozzle 32 at the timing of the wafer W absent right under the first process gas nozzle 31 and/or the second process gas nozzle 32.

Furthermore, when the flow rate needs to be changed while supplying the process gas at a predetermined flow rate from the first process gas nozzle 31 and/or the second process gas nozzle 32, the controller 100 is preferred to change the flow rate at the timing of the wafer W absent right under the first process gas nozzle 31 and/or the second process gas nozzle 32. This is because the change of the flow rate of the process gas can be also a factor of causing particles to soar when the particles are present in the pipes 34 and 36. In particular, in the second process gas nozzle 32 for supplying the reaction gas, the supply flow rate of the reaction gas is often set at a great value, for example, 10 slm. In such a case, a method of supplying the reaction gas at a flow rate of 4 slm at first and then increasing the flow rate up to 10 slm is often adopted without supplying the reaction gas at the flow rate of 10 slm from the beginning. The substrate processing method of the present embodiment can be also preferably applied to such a case.

Figure 9:
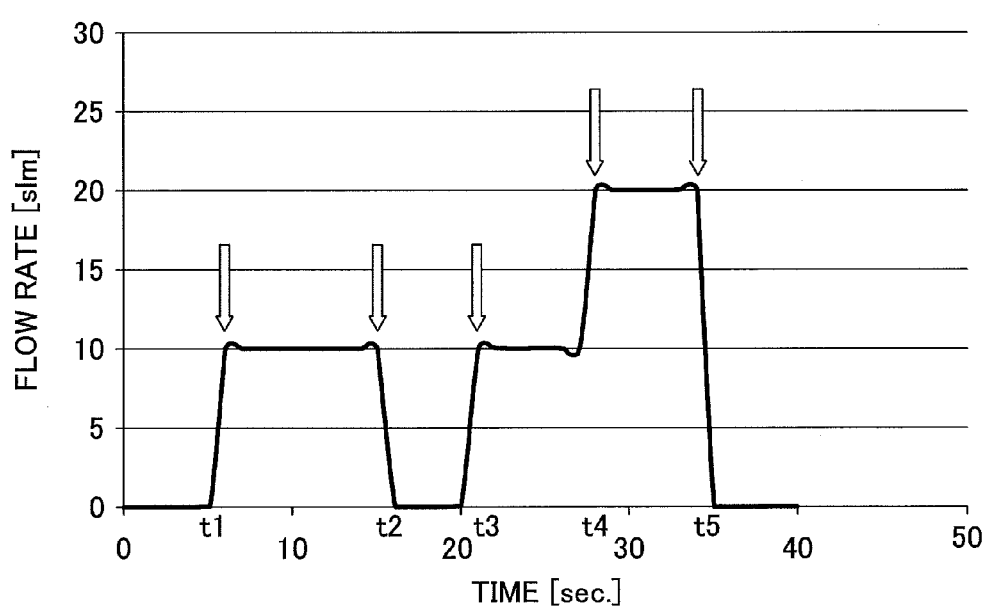
FIG. 9 is a timing chart illustrating an example of timing likely to generate particles.

FIG. 9 is a timing chart illustrating an example of a timing having a possibility of causing particles. In FIG. 9, the transverse axis shows time (second), and the longitudinal axis shows a flow rate (slm) of a process gas supplied from a process gas nozzle.

At time t1, the flow rate increases from 0 slm to 10 slm, which illustrates a change of the supply flow rate at the beginning of supplying the process gas. As discussed above, because the start timing of supplying the process gas is a timing that can generate particles, the substrate processing method of the present embodiment that supplies the process gas to the area between the recesses 24 can be applied.

At time t2, the flow rate decreases from 10 slm to 0 slm, which illustrates a change of the supply flow rate at the time of stopping the supply of the process gas. As discussed above, because the timing of stopping the supply of the process gas is timing that can generate particles, the substrate processing method of the present embodiment that supplies the process gas to the area between the recesses 24 can be applied.

At time t3, the flow rate increases from 0 slm to 10 slm, and a description is omitted because the timing is the same as the start timing of supplying the process gas at t1.

At time t4, the flow rate increases from 10 slm to 20 slm, which illustrates a change of the supply flow rate at the time of changing the flow rate. As discussed above, because the timing of changing the flow rate of the process gas is a timing that can generate particles, the substrate processing method of the present embodiment that supplies the process gas to the area between the recesses 24 can be applied. Such a change is often performed in supplying a reaction gas that is supplied at a great flow rate such as an oxidation gas, a nitriding gas or the like in particular.

At time t5, the flow rate decreases from 20 slm to 0 slm, which illustrates a change of the supply flow rate at the time of stopping the supply of the process gas. Although a variation amount of the flow rate differs from the case of time t2, because the change is similar to the case of time t2, the description is omitted.

In this manner, because the particles are liable to be generated at least when starting the supply of the process gas, when stopping the supply of the process gas and when changing the flow rate, the substrate processing method of the present embodiment is preferred to be performed at least at the above timing.

In FIG. 9, although the changes of the flow rate occur in a short time, a gradual flow rate change that gradually increases or decreases can also occur. In such a case, because the flow rate change is slow, a possibility of generating particles is smaller than the changes illustrated in FIG. 9. However, because the particles are liable to be generated depending on an inclination of the flow rate change and a magnitude of the flow rate change, the substrate processing method of the present embodiment can be applied to the case of performing such a gradual change of the flow rate.

Figure 10:
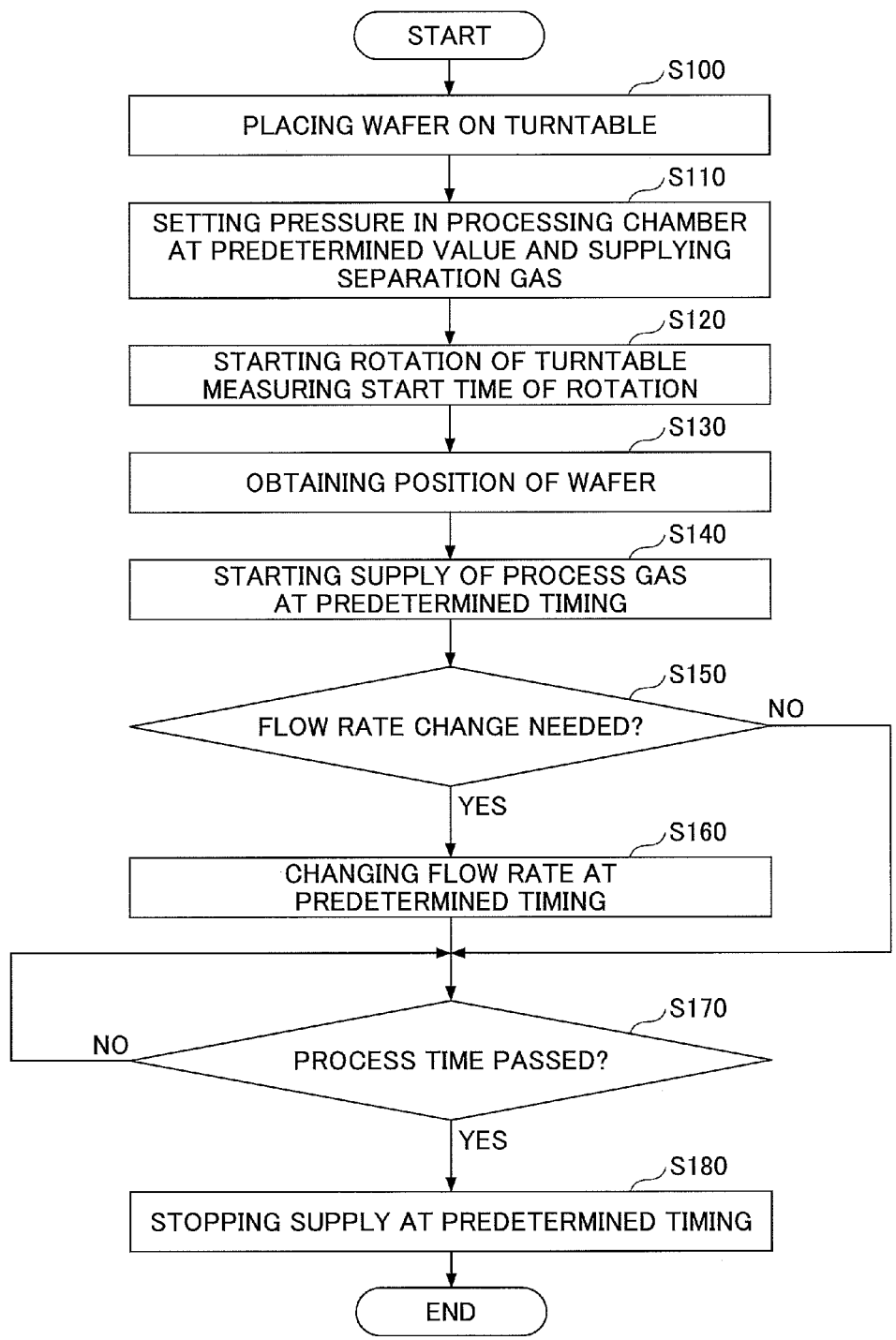
FIG. 10 is a diagram illustrating an example of a process flow of the substrate processing method according to an embodiment of the present invention.

Next, a description is given below of a process flow of the substrate processing method of an embodiment of the present invention. FIG. 10 is a diagram illustrating a process flow of an example of the substrate processing method of the embodiment of the present invention. The same numerals are attached to the components described above, and the description is omitted.

In step S100, a wafer W is placed on each of the plurality of recesses 24 provided in the upper surface of the turntable 2. More specifically, to begin with, a gate valve (not illustrated in the drawings) is opened, and the wafer W is transferred into the recess 24 of the turntable 2 through the transfer opening 15 by using the transfer arm 10 (see FIG. 4). When the recess 24 stops at a position facing the transfer opening 15, the wafer W may be transferred into the recess 24 by moving lift pins (not illustrated in the drawings) up and down from the bottom side of the processing chamber 1 via through holes formed in the bottom of the recess 24. Moreover, the wafer W is placed on each of the plurality of (five, in the present embodiment) recesses 24 of the turntable 2 by intermittently rotating the turntable 2.

In step S110, after the inside of the processing chamber 1 is set at a predetermined pressure, a separation gas is supplied into the processing chamber 1. More specifically, after closing the gate valve and evacuating the processing chamber 1 to the lowest ultimate vacuum by using the vacuum pump 640, the separation gas (e.g., $N_2$ gas) is supplied from the separation gas nozzles 41 and 42 at a predetermined flow rate. At this time, the separation gas is also supplied from the separation gas supply pipe 51 and the purge gas supply pipe 72 and 73 (see FIG. 1) at a predetermined flow rate. Furthermore, the pressure inside the processing chamber 1 can be adjusted to a preliminarily set process pressure by using the pressure controller 650.

In step S120, the wafers W are heated by using the heater unit 7 while rotating the turntable 2, for example, in a clockwise fashion. At this time, the time measurement part 103 in the controller 100 measures start time of rotation of the turntable 2.

In step S130, positions of the wafers W during the rotation are always obtained. As discussed above, the time measurement part 103 measures elapsed time from the start time of the rotation of the turntable 2, and current positions of the wafers W are obtained in real time based on the relationship with the rotational speed of the turntable 2.

In step S140, the first process gas nozzle 31 and/or the second process gas nozzle 32 are caused to start supplying a process gas at a predetermined timing. The predetermined timing means a timing when any of the wafers W is not present right under the first process gas nozzle 31 and/or the second process gas nozzle 32 and an area between the adjacent wafers W is present right under the first process gas nozzle 31 and/or the second process gas nozzle 32. This allows particles not to have a negative impact on a process on the wafers W even if the particles are present in the pipes 34 and 36 of the first process gas nozzle 31 and/or the second process gas nozzle 32 because the particles are scattered over the area between the recesses 24. Here, the controller 100 controls the timing of starting the supply of the process gas.

The wafers W are processed by starting the supply of the first and second process gases. When the process is a film deposition process, a source gas is supplied from the first process gas nozzle in the first process area P1 and adsorbs on surfaces of the wafers W, and a reaction gas reactable with the source gas adsorbed on the wafers W is supplied from the second process gas nozzle 32 in the second process area P2. Then, a reaction product of the source gas and the reaction gas deposits on the wafers W, and a molecular layer made of the reaction product deposits on the wafers W. Here, the wafers W periodically pass through the first process area P1, the separation area D, the second process area P2 and the separation area D by the rotation of the turntable 2, and a film deposits on the wafers W for each rotation of the turntable 2.

In step S150, the controller 100 determines whether to need a flow rate change. When the flow rate change is needed according to an instruction of a recipe and the like, the process advances to step S160, and the controller 100 performs the flow rate change by matching the timing of changing the flow rate to the predetermined timing described at step S150. This makes it possible not to have a negative influence on the process of the wafers W by preventing the particles in the pipes 34 and 36 from scattering over the wafers W even when the particles are discharged from the first process gas nozzle 31 and/or the second process gas nozzle 32. In step S150, the controller 100 determines that the flow rate change is not needed, the process goes to step S170.

In step S170, the controller 100 determines whether predetermined process time has passed or not. When the controller 100 determines that the predetermined process time has not passed yet, the process stays at the present step (S170), and the substrate process is continued. In contrast, when the controller 100 determines that the predetermined process time has already passed, the process advances to step S180.

In step S180, the supply of the process gas from the first process gas nozzle 31 and/or the second process gas nozzle 32 is stopped at a predetermined timing. The predetermined timing is the timing described at step S140, and is the timing when the wafer W is not present right under the first process gas nozzle 31 and/or the second process gas nozzle 32. Even if the operation of stopping the supply of the process gas causes the particles in the pipes 34 and 36 to soar and to be discharged from the first process gas nozzle 31 and/or the second process gas nozzle 32, the particles are not scattered over the wafers W, and do not have an adverse impact on the process of the wafers W.

After finishing the supply of the process gases from the first process gas nozzle 31 and the second process gas nozzle 32, the wafers W are carried out of the processing chamber 1 by a reverse procedure to the carry-in procedure. More specifically, the gate valve (not illustrated in the drawings) is opened, and the wafers W on which the film is deposited are carried out of the processing chamber 1 through the transfer opening 15 by using the transfer arm 10 (see FIG. 4). The wafers W are carried out by using the lift pins (not illustrated in the drawings) as well as the carry-in process.

In FIG. 10, although the description has been given by citing an example of performing the timing control at all of the flow rate changes including the timing of starting the supply of the process gas, stopping the supply of the process gas and changing the flow rate performed as necessary, the timing control may be performed at any selected timing. For example, when the timing control is desired to be performed only when starting the supply of the process gas, adopting an embodiment of performing the timing control only when starting the supply of the process gas and not performing the timing control when stopping the supply of the process gas and changing the flow rate of the process gas is also possible.

In this manner, according to the substrate processing apparatus and the substrate processing method of the first embodiment of the present invention, when performing operation including a change of a supply flow rate of a process gas from the process gas nozzles 31 and 32, performing the operation including the change of the supply flow rate immediately above a wafer W can be prevented by an arithmetic process by the controller 100. For example, even when particles are scattered from the process gas nozzles 31 and 32, a dispersal of the particles over the wafer W can be reduced, and a negative impact on the process of the wafer W can be prevented.

Second Embodiment

Figure 11:
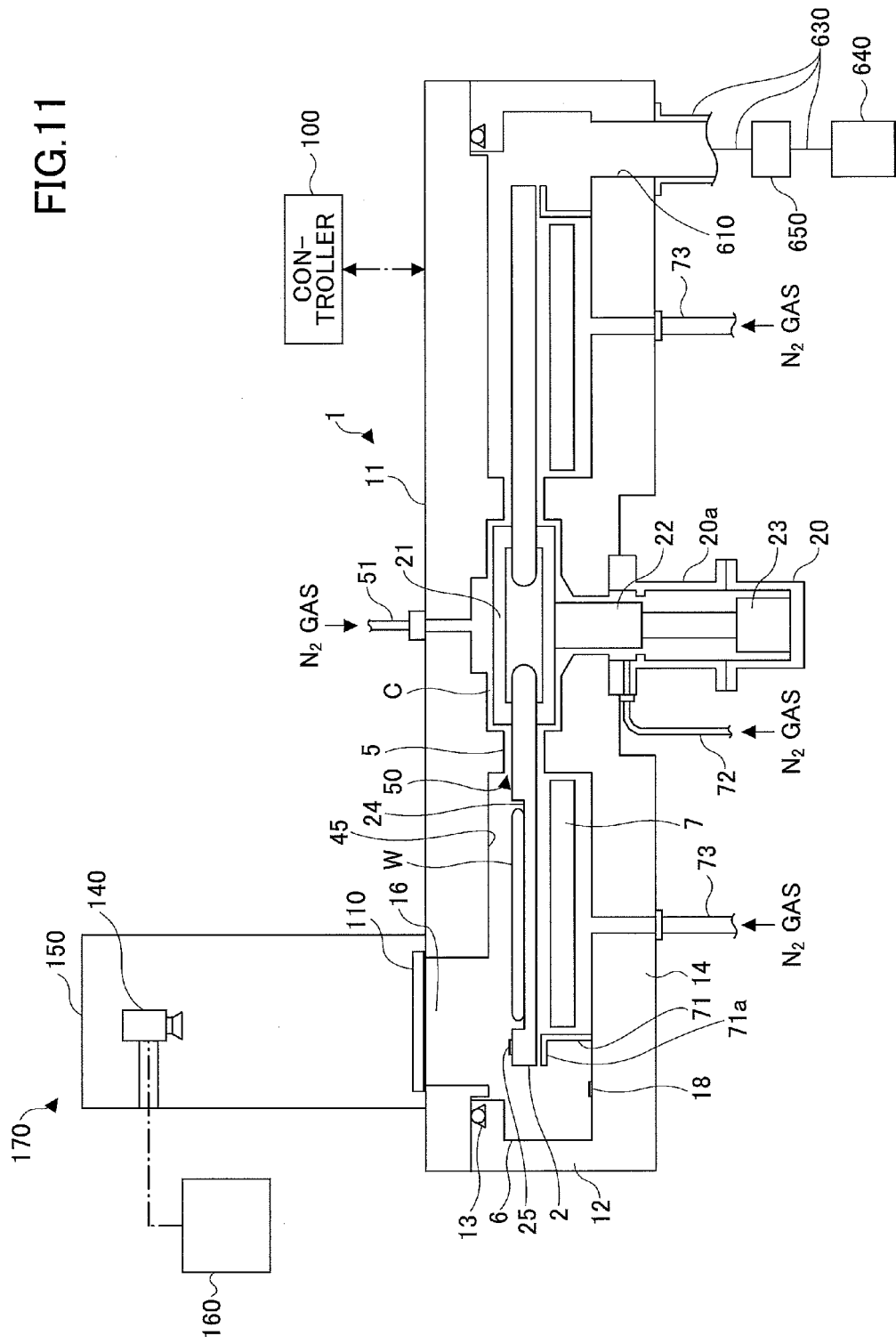
FIG. 11 is an overall configuration diagram illustrating an example of a substrate processing apparatus according to a second embodiment of the present invention.

FIG. 11 is an overall configuration diagram illustrating an example of a substrate processing apparatus of a second embodiment of the present invention. The substrate processing apparatus of the second embodiment differs from the substrate processing apparatus of the first embodiment in that the substrate processing apparatus of the second embodiment includes a substrate position detection device 170 and that an opening 16 and a window 110 are formed in the top plate 11 of the processing chamber 1. The substrate position detection device 170 is a device for detecting a position of a wafer W. The substrate position detection device 170 includes a camera 140, a housing 150, and a processing part 160.

In addition, in the substrate processing apparatus of the second embodiment, the opening 16 is formed in a part of the top plate 11 to be able to take an image of the inside of the processing chamber 1 by the camera 140. The opening 16 is an aperture to be in communication with the inside of the processing chamber 1 from the outside. The processing chamber 1 is sealed by disposing the window 110 so as to close the opening 16.

The processing chamber 1 may include a chamber mark 18. The chamber mark 18 is a mark to indicate a reference position of the processing chamber 1, and the position of the wafer W is detected with reference to the chamber mark 18.

Moreover, a susceptor mark 25 is provided on the upper surface of the turntable (which is also may be referred to as a "susceptor") 2. The position of the wafer W is detected by detecting the susceptor mark 25.

The window 110 is provided to cover the opening 16 so as to close the opening 16 and ensures an imaging field of view to allow the camera 140 provided above thereof to see the inside of the processing chamber 1 from the top. The window 110 may be made of a variety of materials that transmits light. For example, the window 110 may be formed as a quartz window 110 made of quartz.

The camera 140 is an imaging unit to take an image of the inside of the processing chamber 1 through the window 110. A variety of cameras is available for the camera 140 depending on the intended purpose. For example, a CCD (Charge Coupled Device) may be used as the camera 140.

The housing 150 is a case to accommodate the window 110 and the camera 140 therein. The surroundings of the camera 140 become dark by covering the whole of the camera 140 with the housing 150, which can make an environment suitable for imaging.

The processing part 160 is a unit to perform an arithmetic process for detecting the position of the wafer W based on an image taken by the camera 140. Hence, the processing part 160 is configured to be able to perform the arithmetic process. For example, the processing part 160 may be formed as a microcomputer that includes a CPU (Central Processing Unit) and operates by executing a program or an integrated circuit such as an ASIC (Application Specific Integrated Circuit) designed and produced for a specific intended purpose.

Although the position detection device 170 is normally used for alignment of an initial state, the position detection device 170 can be used to detect the position of the wafer W during the rotation. Thus, the position of the wafer W is monitored by using an imaging unit such as the camera 140 and the like, and the controller 100 performs appropriate timing control based on the position of the wafer W.

The timing control by the controller 100 can be performed by a method or a unit similar to the substrate processing method and the substrate processing apparatus of the first embodiment. The substrate processing method and the substrate processing apparatus of the second embodiment differ from the substrate processing method and the substrate processing apparatus of the first embodiment in that the position of the wafer W is not detected by the time measurement but by image processing.

With respect to the other configuration, the description of the substrate processing method and the substrate processing apparatus of the first embodiment can be directly applied.

In this manner, a variety of methods and units can be used for the detection of the position of the wafer W on the turntable 2, which is not limited to the substrate processing method and the substrate processing apparatus according to the first and second embodiments.

According to the substrate processing method and the substrate processing apparatus of the second embodiment, the position of the wafer W can be detected in real time by monitoring the wafer W. This makes it possible to flexibly respond to a change of a process and to perform the operation of starting the supply of the process gas, stopping the supply of the process gas and changing the flow rate of the process gas even when the change occurs in the process.

In addition, because the accumulation of particles in a pipe due to a long-term stop of the apparatus can occur in a substrate processing method and a substrate processing apparatus using a liquid as the fluid or any other substrate processing apparatus using the fluid, the substrate processing method and the substrate processing apparatus according to the embodiments of the present invention can be applied to a variety of substrate processing apparatuses using a fluid.

According to the substrate processing method and the substrate processing apparatus of the embodiments of the present invention, an impact of particles on a substrate process can be reduced.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the method of manufacturing the silicon oxide film has been described in detail, it should be understood that the various changes, substitutions, and alterations could be made hereto without departing from the spirit and scope of the invention.

What is claimed is:

1. A substrate processing method, the method comprising:
placing a plurality of substrates on a plurality of substrate holding areas provided in a surface of a turntable at predetermined intervals in a circumferential direction, the turntable including second areas provided between the adjacent substrate holding areas in the circumferential direction, the turntable being provided in a processing chamber;
rotating the turntable on which the plurality of substrates is placed;
monitoring locations of the second areas of the rotating turntable; and
supplying a fluid to one of the second areas of the turntable while rotating the turntable from a fluid supplying unit configured to supply the fluid directly downward upon detecting that the one of the second areas lies under the fluid supplying unit based on the monitored locations of the second areas in response to an operation of changing a flow rate of the fluid, the operation of changing the flow rate including an operation of starting supply of the fluid.

2. The substrate processing method as claimed in claim 1, wherein the operation of changing the flow rate of the fluid includes at least one of an operation of starting supply of the fluid and an operation of stopping the supply of the fluid.

3. The substrate processing method as claimed in claim 1, wherein the operation of changing the flow rate of the fluid includes an operation of changing the flow rate of the fluid to change a substrate processing condition while continuing to supply the fluid.

4. The substrate processing method as claimed in claim 1, wherein the step of supplying the fluid is a step of supplying a gas.

5. The substrate processing method as claimed in claim 4, wherein a timing of performing the operation of changing the flow rate of the fluid is determined based on time of starting rotation of the turntable, a rotational speed of the turntable and elapsed time from starting the rotation of the turntable.

6. The substrate processing method as claimed in claim 4, wherein a timing of performing the operation of changing the flow rate of the fluid is determined by monitoring a position of the turntable while rotating.

7. The substrate processing method as claimed in claim 4, wherein the fluid is supplied through a nozzle provided extending in a radial direction of the turntable and having a plurality of discharge holes provided facing the surface of the turntable and arranged along the radial direction.

8. The substrate processing method as claimed in claim 4, wherein the processing chamber includes a plurality of process gas supply areas provided apart from each other along the circumferential direction of the turntable, and the step of supplying the gas is performed in each of the plurality of process gas supply areas.

9. The substrate processing method as claimed in claim 8, wherein a separation gas supply area is provided in a space between the plurality of process gas supply areas to divide the plurality of process gas supply areas from each other, and the substrate processing method further comprising a step of:
purging the substrate by supplying the separation gas to the substrate after the step of supplying the gas.

10. The substrate processing method as claimed in claim 9, wherein a source gas adsorbable on the substrate is supplied in one of the plurality of process gas supply areas, and a reaction gas reactable with the source gas is supplied in another one of the plurality of process gas supply areas, thereby depositing a molecular layer made of a reaction product of the source gas and the reaction gas on the substrate.

11. A substrate processing apparatus, comprising:
a processing chamber;
a turntable provided in the processing chamber;
a plurality of substrate holding areas provided in an upper of the turntable at predetermined intervals in a circumferential direction, the turntable including second areas provided between the adjacent substrate holding areas in the circumferential direction;
a fluid supply unit configured to supply a fluid directly downward to the upper surface of the turntable;
a controller configured to monitor locations of the second areas during rotation of the turntable and to cause the fluid supply unit to supply the fluid directly downward to one of the second areas between the plurality of substrate holding areas upon detecting the one of the second areas lies under the fluid supply unit based on the monitored locations of the second areas while synchronizing an operation of changing a flow rate of the fluid during the rotation of the turntable, the operation of changing the flow rate including an operation of starting supply of the fluid.

12. The substrate processing apparatus as claimed in claim 11, wherein the operation of changing the flow rate of the fluid includes at least one of an operation of starting supply of the fluid and an operation of stopping the supply of the fluid.

13. The substrate processing apparatus as claimed in claim 11, wherein the operation of changing the flow rate of the fluid includes an operation of changing the flow rate of the fluid to change a substrate processing condition while continuing to supply the fluid.

14. The substrate processing apparatus as claimed in claim 11, wherein a timing of the operation of changing the flow rate of the fluid is determined based on a timing of starting rotation of the turntable, a rotational speed of the turntable and elapsed time from starting the rotation of the turntable.

15. The substrate processing apparatus as claimed in claim 11, further comprising:
an imaging unit configured to take an image of a position of the turntable in a rotational direction,
wherein a timing of the operation of changing the flow rate of the fluid is determined by monitoring the position of the turntable in the rotational direction while rotating the turntable by the imaging unit.

16. The substrate processing apparatus as claimed in claim 11,
wherein the fluid is a gas, and
wherein the fluid supply unit includes a nozzle provided extending in a radial direction of the turntable and having a plurality of discharge holes provided facing the upper surface of the turntable and arranged along the radial direction, and a flow rate controller configured to determine the flow rate of the gas.

17. The substrate processing apparatus as claimed in claim 16,
wherein the processing chamber includes a plurality of process gas supply areas provided apart from each other in the circumferential direction of the turntable, and
wherein the controller causes the fluid supply unit to supply the fluid to the area between the plurality of substrate holding areas by synchronizing the operation of changing the flow rate of the gas at each of the plurality of gas supply areas.

18. The substrate processing apparatus as claimed in claim 17, further comprising:
a separation gas supply area provided in a space between the plurality of process gas supply areas to divide the plurality of the process gas supply areas from each other by supplying a purge gas to the substrate.

19. The substrate processing apparatus as claimed in claim 18, wherein one of the plurality of process gas supply areas is configured to supply a source gas adsorbable on the substrate to the substrate, and another one of the plurality of process gas supply areas is configured to supply a reaction gas reactable with the source gas to be able to deposit a molecular layer made of a reaction product of the source gas and the reaction gas on the substrate.

* * * * *